(12) United States Patent
Wiebe et al.

(10) Patent No.: US 10,320,360 B2
(45) Date of Patent: Jun. 11, 2019

(54) QUANTUM ALGORITHMS FOR ARITHMETIC AND FUNCTION SYNTHESIS

(71) Applicant: Microsoft Technology Licensing, LLC, Redmond, WA (US)

(72) Inventors: Nathan Wiebe, Redmond, WA (US); Martin Roetteler, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 78 days.

(21) Appl. No.: 15/316,500

(22) PCT Filed: Jun. 5, 2015

(86) PCT No.: PCT/US2015/034318
§ 371 (c)(1),
(2) Date: Dec. 5, 2016

(87) PCT Pub. No.: WO2015/188025
PCT Pub. Date: Dec. 10, 2015

(65) Prior Publication Data
US 2017/0194930 A1    Jul. 6, 2017

Related U.S. Application Data

(60) Provisional application No. 62/009,066, filed on Jun. 6, 2014.

(51) Int. Cl.
*H03H 7/21*    (2006.01)
*B82Y 10/00*    (2011.01)
(Continued)

(52) U.S. Cl.
CPC ............... *H03H 7/21* (2013.01); *B82Y 10/00* (2013.01); *G06F 7/523* (2013.01); *G06F 7/548* (2013.01); *G06F 17/17* (2013.01); *G06N 10/00* (2019.01)

(58) Field of Classification Search
CPC . G06F 17/00; G06F 17/17; G06F 7/00; G06F 7/523; G06F 7/548; G06N 99/00;
(Continued)

(56) References Cited

U.S. PATENT DOCUMENTS 7,018,852 B2 *    3/2006    Wu .................... B82Y 10/00
                                                            438/2
8,566,321 B2    10/2013    Majumdar

FOREIGN PATENT DOCUMENTS

CN    1350664 A    5/2002
CN    101569200 A    10/2009

OTHER PUBLICATIONS

Abdollahi et al., "Reversible Logic Synthesis by Quantum Rotation Gates," available at http://arxiv.org/pdf/1302.5382v2, pp. 1-19 (Mar. 23, 2013).
(Continued)

*Primary Examiner* — Lincoln D Donovan
*Assistant Examiner* — Dave Mattison
(74) *Attorney, Agent, or Firm* — Klarquist Sparkman, LLP

(57) ABSTRACT

Quantum circuits and associated methods use Repeat-Until-Success (RUS) circuits to perform approximate multiplication and approximate squaring of input values supplied as rotations encoded on ancilla qubits. So-called gearbox and programmable ancilla circuits are coupled to encode even or odd products of input values as a rotation of a target qubit. In other examples, quantum RUS circuits provide target qubit rotations that are associated with reciprocals using series expansion representations.

21 Claims, 11 Drawing Sheets

(51) Int. Cl.
    G06F 17/17    (2006.01)
    G06F 7/523    (2006.01)
    G06F 7/548    (2006.01)
    G06N 10/00    (2019.01)
(58) Field of Classification Search
    CPC ...... G06N 99/002; G11C 7/00; G11C 7/1066;
            G11C 7/1072; H03H 7/00; H03H 7/21;
            H03L 7/00; H04L 7/00; H04L 7/0337;
                                          H04L 7/04
    USPC .......................................... 327/233
    See application file for complete search history.

(56) References Cited

OTHER PUBLICATIONS

Amy et al., "A Meet-in-the-Middle Algorithm for Fast Synthesis of Depth-Optimal Quantum Circuits," available at http://arxiv.org/pdf/1206.0758v3, pp. 1-23 (Jan. 25, 2013).
Barenco et al., "Elementary Gates for Quantum Computation," *Physical Review A*, 52: 3457-3467 (Nov. 1995).
Beauregard, "Circuit for Shor's Algorithm using 2n + 3 Qubits," available at http://arxiv.org/quant-ph/0205095v3, pp. 1-14 (Feb. 21, 2003).
Beckman et al., "Efficient Networks for Quantum Factoring," *Physical Review A*, 54:1034-1063 (Aug. 1996).
Beige et al., "A Repeat-Until-Success Quantum Computing Scheme," *New Journal of Physics*, 9:1-8 (Jun. 2007).
Bennett, "Logical Reversibility of Computation," *IBM Journal of Research and Development*, 17:525-532 (Nov. 1973).
Berry et al., "Exponential Improvement in Precision for Simulating Sparse Hamiltonians," available at http://arxiv.org/pdf/1312.1414v1, pp. 1-27 (Dec. 5, 2013).
Bocharov et al., "Efficient Synthesis of Universal Repeat-Until-Success Circuits," available at http://arxiv.org/pdf/1404.5320v1, pp. 1-16 (Apr. 21, 2014).
Bollig et al., "New Results on the Most Significant Bit of Integer Multiplication," *Theory Comput. Syst.*, 48:170-188 (2011).
Brassard et al., "Quantum Amplitude Amplification and Estimation," available at http://arxiv.org/quant-ph/0005055v1, pp. 1-32 (May 2, 2000).
Cao et al., "Quantum Algorithm and Circuit Design Solving the Poisson Equation," available at http://arxiv.org/pdf/1207.2485v3, pp. 1-30 (Nov. 11, 2012).
Cleve et al., "Quantum Algorithms Revisited," *Phil. Trans. R. Soc. Lond. A*, pp. 1-18 (1996).
Cuccaro et al., "A New Quantum Ripple-Carry Addition Circuit," available at http://arxiv.org/quant-ph/0410184v1, pp. 1-9 (Oct. 22, 2004).
Draper et al., "A Logarithmic-Depth Quantum Carry-Lookahead Adder," *Quantum Information and Computation*, 6:351-369 (2006).
Harrow et al., "Quantum Algorithm for Linear Systems of Equations," *Physical Review Letters*, 103:150502-1-150502-4 (Oct. 9, 2009).
International Preliminary Report on Patentability from International Application No. PCT/US2015/034318, dated Sep. 8, 2016, 11 pages.
International Search Report and Written Opinion from International Application No. PCT/US2015/034318, dated Nov. 2, 2015, 14 pages.
Jones, "Logic Synthesis for Fault-Tolerant Quantum Computers," *Dissertation for the Degree of Doctor of Philosophy*, 201 pages (Oct. 2013).
Jones et al., "Faster Quantum Chemistry Simulation on Fault-Tolerant Quantum Computers," *New Journal of Physics*, 14:1-35 (Nov. 27, 2012).
Jones et al., "Simulating Chemistry Efficiently on Fault-Tolerant Quantum Computers," available at http://arxiv.org/pdf/1204.0567v1, pp. 1-33 (Apr. 3, 2012).

Kaye et al., "An Introduction to Quantum Computing," *Oxford University Press*, 287 pages (Jan. 18, 2007).
Kitaev, "Quantum Computations: Algorithms and Error Correction," *Russ. Math. Surv.*, 52:1191-1249 (Dec. 1997).
Lim et al., "Repeat-Until-Success Linear Optics Distributed Quantum Computing," *Phys. Rev. Lett.*, 95:030505-1-030505-4 (Jul. 13, 2005).
Lim et al., "Repeat-Until-Success Quantum Computing Using Stationary and Flying Qubits," available at http://arxiv.org/quant-ph/0508218v3, pp. 1-14 (Nov. 2, 2005).
Lim et al., "Repeat-Until-Success Quantum Computing Using Stationary and Flying Qubits," *Physical Review A*, 73:1-14 (Jan. 2006).
Lin et al., "RMDDS: Reed-Muller Decision Diagram Synthesis of Reversible Logic Circuits," *ACM Journal on Emerging Technologies in Computing Systems*, 10:A1-A28 (Feb. 2014).
Maslov et al., "Techniques for the Synthesis of Reversible Toffoli Networks," *ACM Transactions on Design Automation of Electronic Systems*, 12:42:1-42:28, (Sep. 2007).
Meter et al., "Fast Quantum Modular Exponentiation," *Physical Review A* 71:052320-1-052320-12 (May 17, 2005).
Miller et al., "A Transformation based Algorithm for Reversible Logic Synthesis," *Proceedings of the 40th Annual Design Automation Conference*, 6 pages (Jun. 2, 2003).
Motwani et al., "Randomized Algorithms," Cambridge University Press, 488 pages, (Aug. 25, 1995).
Nielsen et al., "Quantum Computation and Quantum Information," *Cambridge University Press*, pp. 1-29 (2010).
Paetznick et al., "Repeat-Until-Success: Non-Deterministic Decomposition of Single-Qubit Unitaries," *Quantum of Physics*, (Nov. 5, 2013).
Paetznick et al., "Repeat-Until-Success: Non-Deterministic Decomposition of Single-Qubit Unitaries," retrieved from http://arxiv.org/pdf/1311.1074v1.pdf, pp. 1-24 (Nov. 5, 2013).
Pham et al., "A 2D Nearest-Neighbor Quantum Architecture for Factoring in Polylogarithmic Depth," *Quantum Information and Computation*, 13: 937-962 (Jul. 2013).
Proos et al., "Shor's Discrete Logarithm Quantum Algorithm for Elliptic Curves," *Quantum Information and Computation*, 3:1-35 (Jan. 25, 2003).
Saeedi et al., "Quantum Circuits for GCD Computation with O(n log n) Depth and O(n) Ancillae," available at http://arxiv.org/pdf/1304.7516v1, pp. 1-5 (Apr. 28, 2013).
Shafaei et al., "Reversible Logic Synthesis of k-Input, m-Output Lookup Tables," *Design, Automation and Test in Europe Conference and Exhibition*, 6 pages (Mar. 18, 2013).
Shende et al., "Synthesis of Quantum Logic Circuits," available at http://arxiv.org/quant-ph/0406176v5, pp. 1-19 (Apr. 18, 2006).
Shor, "Polynomial-Time Algorithms for Prime Factorization and Discrete Logarithms on a Quantum Computer," available at http://arxiv.org/quant-ph/9508027v2, pp. 1-28 (Jan. 25, 1996).
Skliar et al., "A New Method for the Analysis of Signals: The Square Wave Method," *Revista de Matemática: Teoría y Aplicaciones*, 15:109-129 (2008).
Thaker et al., "Quantum Memory Hierarchies: Efficient Designs to Match Available Parallelism in Quantum Computing," *Proceedings of the 33rd International Symposium on Computer Architecture*, 12 pages (Jun. 17, 2006).
Vedral et al., "Quantum Networks for Elementary Arithmetic Operations," *Physical Review A*, 54:147-153 (Jul. 1996).
Wang, "Quantum Algorithms for Curve Fitting," available at http://arxiv.org/pdf/1402.0660v3, pp. 1-22 (Apr. 2, 2014).
Wegener et al., "New Results on the Complexity of the Middle Bit of Multiplication," *Computational Complexity*, 16:1-28 (Oct. 2007).
Wiebe et al., "Floating Point Representations in Quantum Circuit Synthesis," *New Journal of Physics*, 15:1-24 (Sep. 2013).
Wiebe et al., "Quantum Algorithm for Data Fitting," *Physical Review Letters*, 109:050505-1-050505-5 (Aug. 3, 2012).
Written Opinion of the International Preliminary Examining Authority from International Application No. PCT/US2015/034318, dated Apr. 28, 2016, 5 pages.

(56) References Cited

OTHER PUBLICATIONS

Office Action and Search Report issued in Chinese Patent Application No. 201580030023.X, dated Jul. 4, 2018, 10 pages (with English translation).

* cited by examiner

| Circuit | Function | Success probability | Correction circuit |
| --- | --- | --- | --- |
| $\phi_1 = \phi_2$ | $\phi_1 + \phi_2$ | 100% | — |
| $PAR(\phi_1,\ldots,\phi_k)$ | $\prod_{i=1}^{k}\phi_i + O(\max_i|\phi_i|^{k+2})$ | $\frac{1}{2}\left(\prod_{i=1}^{k}\cos(\phi_i)^2 + \prod_{i=1}^{k}\sin(\phi_i)^2\right)$ | 1 or $2PAR(\phi_1,\ldots,\phi_k)$ |
| $GB(\phi_1,\ldots,\phi_k)$ | $\prod_{i=1}^{k}\phi_i^2 + O(\max_i|\phi_i|^{2k+2})$ | $\left(1 - \prod_{i=1}^{k}\sin^2(\phi_i)\right)^2 + \prod_{i=1}^{k}\sin^4(\phi_i)$ | $e^{i\pi/4 X}$ (Clifford) |

FIG. 8A

FIG. 8B $$PAR(PAR(\phi_1,\ldots,\phi_k),\phi_{k+1}) = PAR(\phi_1,\ldots,\phi_{k+1})$$ (Associativity)
$$PAR(\phi_1,\phi_2) = PAR(\phi_2,\phi_1)$$ (Commutativity)
$$PAR(\phi_1 + m\pi, \phi_2 + n\pi) = PAR(\phi_1,\phi_2)$$ (Periodicity)
$$PAR(\phi_1(-1)^{p_1},\ldots,\phi_k(-1)^{p_k}) = (-1)^{\sum p_i} PAR(\phi_1,\ldots,\phi_k)$$ (Oddness)
$$PAR(\phi_1,\ldots,\phi_k) = \phi_1 \cdots \phi_k + O(\max_i|\phi_i|^{k+2})$$ (Approximate Linearity)
$$\forall \phi_1 \in (-\pi/2,\pi/2), \lim_{k\to\infty} PAR^{\circ k}(\phi_1,\phi_2) = \frac{\pi}{4}(H_{\text{Heaviside}}(\phi_2/\pi - 1/4) + 1)$$ (Square Wave Limit)

| Name | Multiplication formula | Error | Qubits (RUS) |
| --- | --- | --- | --- |
| $M_4$ | $PAR(\phi_1,\phi_2)$ | $O(x^4)$ | 4 |
| $M_6$ | $PAR(\phi_1,\phi_2, \frac{\pi}{2} - GB(\gamma_1,\phi_1) - GB(\gamma_1,\phi_2))$ | $O(x^6)$ | 5 |
| $M_8$ | $PAR(\phi_1,\phi_2, \frac{\pi}{2} - GB(\gamma_1,\phi_1) - GB(\gamma_1,\phi_2), \frac{\pi}{2} - GB(\gamma_2,\phi_1) - GB(\gamma_2,\phi_2) + GB(\gamma_3,\phi_1,\phi_2))$ | $O(x^8)$ | 7 |

FIG. 9

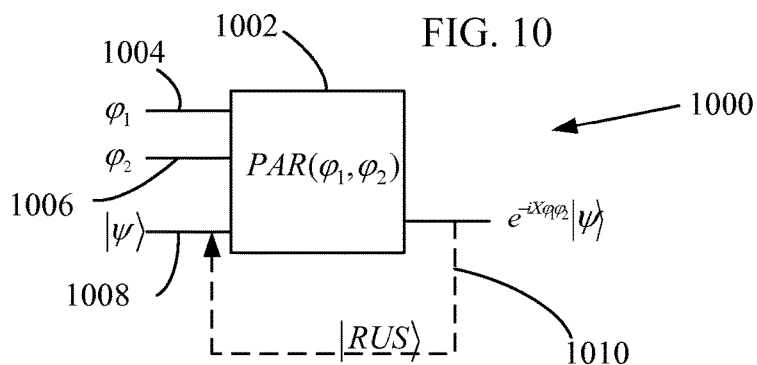

FIG. 10

| use | Formula | Maximum error |
|---|---|---|
| | $1.012194 + .608948y + 2.664355y^2$ | $1.6 \times 10^{-2}$ |
| | $1.000359 + .986359y + 1.490195y^2 - 1.352554y^3 + 5.019604y^4$ | $5.1 \times 10^{-4}$ |
| | $1.000012 + .999020y + 1.050785y^2 + .336629y^3 + 4.385547y^4 - 7.285458y^5 + 8.456853y^6$ | $1.2 \times 10^{-5}$ |

VII: Chebyshev approximants to $1/(1-y)$ on $y = 0 \ldots 1/2$ where $y = 1 - 2^{-\lfloor \log_2 a \rfloor}a$.

EVALUATE FUNCTION ON MESH
1502

FIT APPROXIMATE SQUARE WAVES TO FUNCTION VALUES ON MESH POINTS
1504

SOLVE FOR SQUARE WAVE COEFFICIENTS
1506

QUANTUM ALGORITHMS FOR ARITHMETIC AND FUNCTION SYNTHESIS

CROSS REFERENCE TO RELATED APPLICATIONS

This is the U.S. National Stage of International Application No. PCT/US2015/034318, filed Jun. 5, 2015, which was published in English under PCT Article 21(2), which in turn claims the benefit of U.S. Provisional Application No. 62/009,066, filed Jun. 6, 2014. The provisional application is incorporated herein by reference in its entirety.

BACKGROUND

Quantum computers promise substantial speedups for a host of important problems such as factoring, quantum simulation and optimization. Despite the fact that quantum properties have proven to be powerful resources for these algorithms, the foundation of many of these algorithms often reduces to classical reversible logic interspersed with Hadamard gates. This is especially true for algorithms, such as the quantum linear—systems algorithm that promise exponential speedups but rely strongly on implementing classical arithmetic. For practical inversion problems, hundreds of ancillary qubits may be needed to implement the arithmetic operations needed to perform the arithmetic reversibly. Typically quantum implementations of arithmetic operations use reversible circuits to implement rotations of a target system by using a "phase-kickback" approach described by Kitaev, "Quantum computations: algorithms and error correction," Russian Math. Surveys 52:1191-1249 (1998), and Cleve et al. "Quantum algorithms revisited," Proc. Royal Society of London (Series A) 454:339-354 (1997). Unfortunately, approaches based on classical arithmetic and phase-kickback require many qubits, and alternative approaches are needed.

SUMMARY

Quantum repeat-until-success (RUS) multiplication circuits are coupled to ancilla qubits having phases associated with values of function variables. At a target qubit output, a target qubit phase is based on a product of the phases coupled to the RUS multiplication circuit with the ancilla qubits, if a measurement circuit coupled to the ancilla qubits indicates success. Otherwise, a correction circuit is coupled to apply a correction to the target qubit, and the multiplication process is repeated. Gearbox (GB) and programmable ancilla rotation (PAR) circuits can be used for multiplication, and any error terms corrected within a selected error limit with additional GB or PAR circuits, or combinations thereof. Functions can be evaluated based on, for example, Taylor series representations, and RUS circuits arranged to provide multiplications of input values corresponding to terms in the Taylor series representations. In some examples, a plurality of ancilla qubits are coupled to an RUS multiplication circuit, and a target qubit phase is based on a product of phases applied to the RUS multiplication circuit with the plurality of ancilla qubits. In some cases, the target qubit phase corresponds to even or odd powers of a product of the phases applied to the RUS multiplication circuit with the plurality of ancilla qubits, and a gearbox or PAR circuit is selected based on whether an even or odd power is to be calculated. Correction circuits can include at least one Clifford gate.

These and other features and aspects of the disclosure are set forth below with reference to the accompanying drawings.

BRIEF DESCRIPTION OF THE DRAWINGS

FIG. 8A is table listing properties of various quantum arithmetic circuits.

FIG. 8B is a table listing some additional properties of PAR circuits.

FIG. 9 is a table listing properties of selected multiplication circuits.

FIG. 10 illustrates a multiplication circuit based on a PAR circuit.

DETAILED DESCRIPTION

Figure 1:
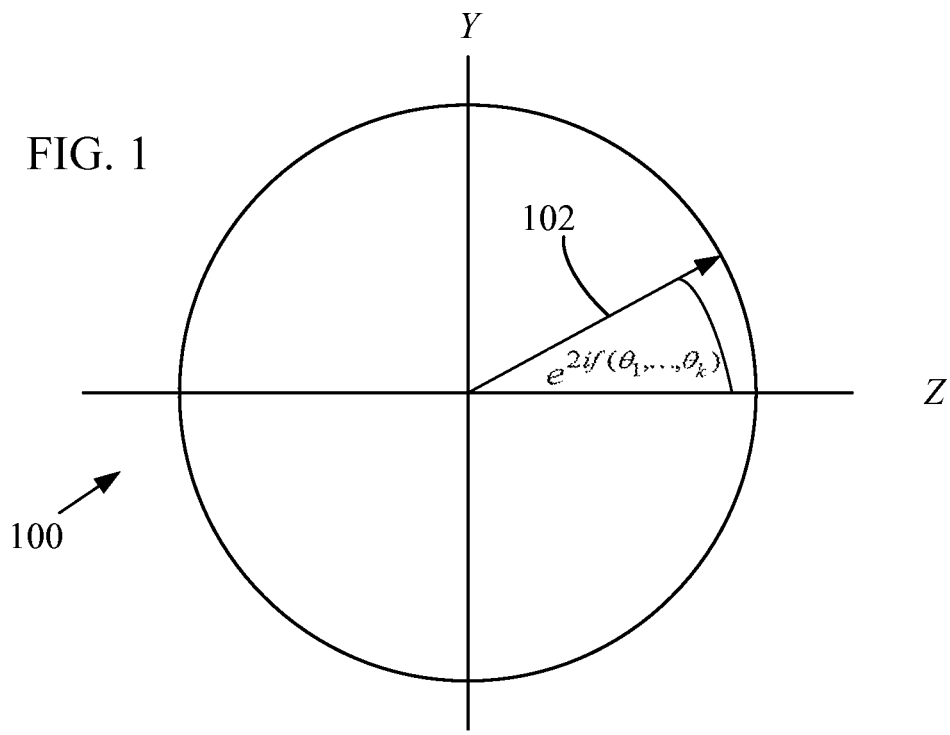
FIG. 1 illustrates encoding based on a rotation angle on the Bloch sphere.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Disclosed herein are quantum computational methods and apparatus that permit numerical analysis using numerical approximations. Representative mathematical analyses can require basic arithmetic operations such as addition, multiplication, and division of integers or real numbers. Other analyses also encompass the evaluation, interpolation, differentiation and integration of functions in one or many variables. In some representative examples, quantum computational arithmetic methods and apparatus are disclosed that can perform transformations on numbers that are encoded as rotated states in a Bloch sphere representation. The disclosed circuits and methods typically use ancilla qubits to represent values of input variables. States of these ancilla qubits are measured to determine method/circuit success. Output values are encoded on qubits referred to herein as target qubits.

Data Encoding as Qubit Rotations

Conventional approaches to implementing arithmetic and numerical analysis operations in quantum computers typically use multiple qubits to encode numbers as qubit strings. While such encodings can be used, in the disclosed examples, a single qubit is typically used for encoding. FIG. 1 illustrates a section 100 of a Bloch sphere, and in particular, a section in an YZ-plane. A vector 102 has an angle of rotation $\varphi = f(\theta_1, \ldots, \theta_k)$ about an X-axis (into the page of FIG. 1) with respect to the Y-axis, wherein $f(\theta_1, \ldots, \theta_k)$ is a function of multiple variables $\theta_1, \ldots, \theta_k$. The angle $\varphi$ thus represents the value of the function. In other examples, rotations about other axes can be used. Rotation angles thus serve to encode numerical values, and multi-qubit encodings are not needed. For example, a rotation of magnitude $f(x)$ about an X-axis is applied to a single qubit in a state $|\psi\rangle$, wherein X is the Pauli X operator, to encode a value on the state $|\psi\rangle$).

Figure 2:
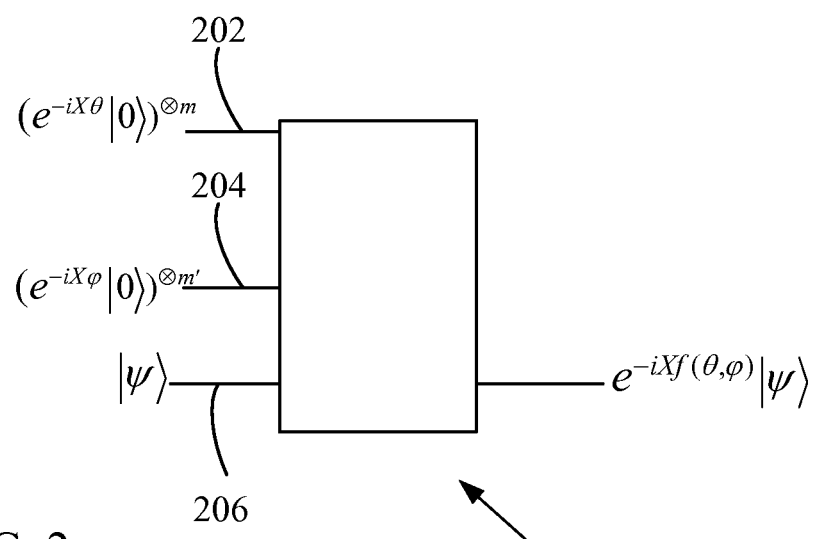
FIG. 2 illustrates a representative repeat-until-success (RUS) multiplication circuit.

One advantage of this approach to encoding is that the value of x need not be known: a quantum circuit that is promised to output $e^{-i\varphi X}$ suffices. Thus, performing arithmetic on amplitudes, or equivalently on rotation angles, can be done in place of doing arithmetic on quantum bit strings. This can substantially reduce the memory required to perform certain quantum computations. In some examples, quantum data consists of just one qubit, initialized in a state $|\psi\rangle$ and the operation to be applied to $|\psi\rangle$ is a rotation around the X-axis, where the rotation angle is given by a function $f:\{0,1\}^n \to \mathbb{R}$, wherein $f$ is a known function. In other words, the unitary $|\psi\rangle \mapsto e^{-if(x)X}|\psi\rangle$ is implemented. Addition and subtraction operations can be encoded based on sums and differences of rotations performed in series. Multiplication circuits and methods for rotation angles are discussed below. Based on implementation of these operations, circuits for arbitrary smooth functions can be obtained. FIG. 2 is a schematic representative of a quantum circuit 200 that receives encoded values corresponding to rotation angles $\theta$, $\varphi$ with ancilla qubits 202, 204. A target qubit 206 is coupled to the circuit 200 so as to be output in a state corresponding to $e^{-iXf(\theta,\varphi)}|\psi\rangle$, wherein $f$ is an arbitrary function of variables $\theta$, $\varphi$.

The disclosed examples are described with reference to the Clifford+T gate set. This set includes the Hadamard gate, the CNOT gate, and the T-gate. This gate set is particularly convenient, but the disclosed methods are not limited to this particular gate set. Numerical values are generally represented as rotation angles, and it is assumed in some examples that additional circuits (not necessarily described) are arranged to perform single qubit rotations $e^{-i\varphi_j X}$ for qubits $j=1, \ldots, k$ so that the unitary $e^{-if(\varphi_1, \ldots, \varphi_k)X}$ can be realized. As noted above, the rotation angles $\varphi_1, \ldots, \varphi_k$ need not be known so long as the function $f$ is known.

Repeat-Until-Success (RUS) Circuits for Arithmetic

Repeat-Until-Success (RUS) circuits are used for a variety of mathematical operations. RUS circuits generally permit probabilistic execution of unitaries, in particular the conditional application of unitary operations to parts of quantum data depending on the outcomes of earlier measurements. This execution is done so that whenever a particular branch of a computation leads to a failure, this failure is detectable and leads to a correctable error. It is generally convenient that any such failure/error be correctible by a Clifford gate, but other correction procedures can be used. It is especially convenient if any such correction operation is the identity, i.e., no correction is needed and the circuit can be repeated until a desired measurement outcome ("success") is obtained.

Disclosed below are quantum RUS circuits that permit calculation of powers of input variables and their products. These circuits can be combined to implement a selected function in a Taylor series approximation, represented as a sum of functions generated by PAR and gearbox circuits to leading order. Typically, to obtain a selected accuracy, errors introduced by approximating a polynomial using PAR and gearbox circuits are corrected with additional PAR and gearbox circuits. In some cases, RUS portions of circuits are omitted from the figures and not discussed in order to better illustrate how arithmetic procedures are performed upon circuit success.

Figure 5:
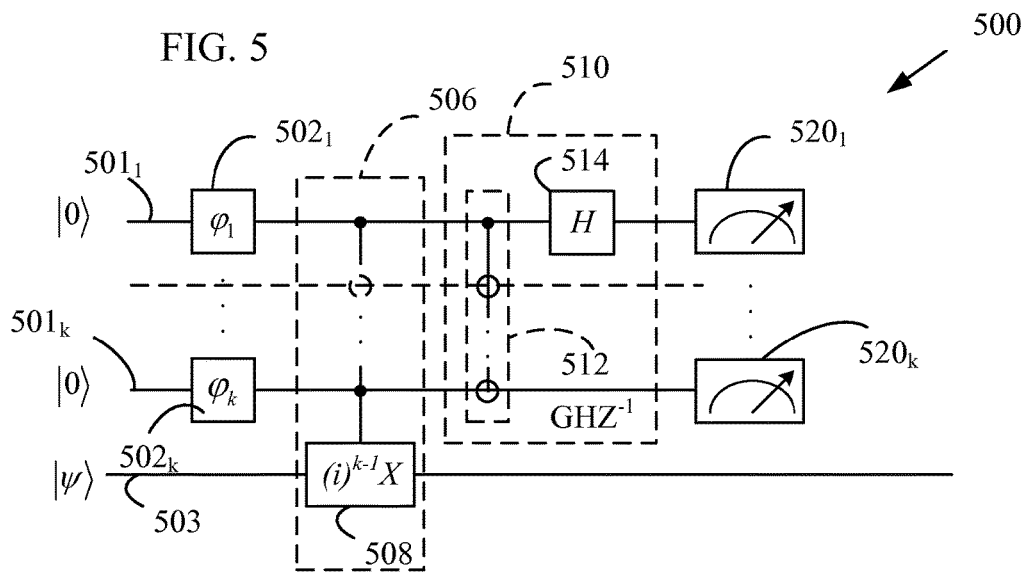
FIG. 5 illustrates a programmable ancilla rotation (PAR) circuit.

In general, a PAR circuit as defined in FIG. 5 is not an RUS circuit as there can be error outcomes that cannot be corrected using Clifford circuits (see also FIG. 8A). Using the oblivious amplitude amplification technique as described by Childs et al "Exponential improvement in precision for simulating sparse Hamiltonians," arXiv:1312.1414 (2013) a PAR circuit can be converted into an RUS circuit by coupling with one additional ancilla qubit. In the following we use the term PAR circuit to denote both variants of the PAR circuit.

Figure 3:
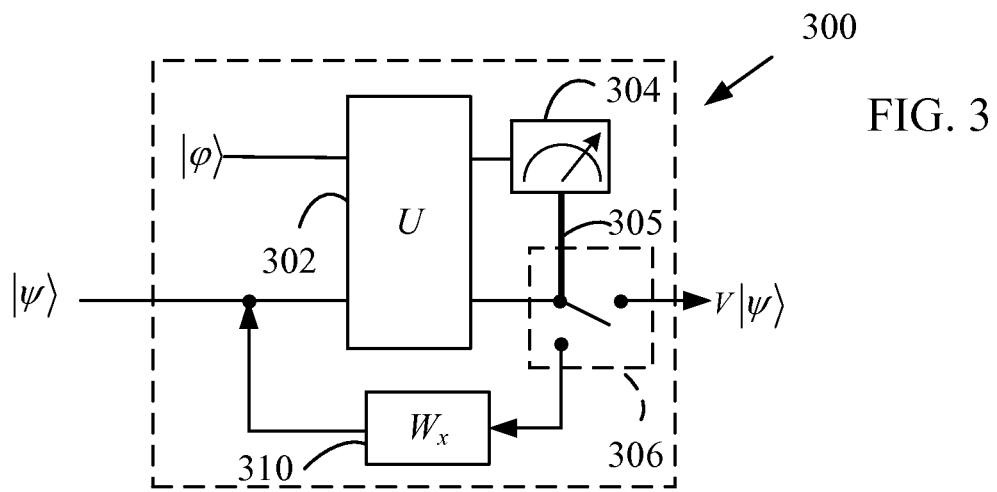
FIG. 3 illustrates operation of an RUS circuit.

FIG. 3 illustrates a representative Repeat-Until-Success (RUS) circuit 300 that implements a unitary transformation V associated with evaluation of a predetermined function. A transformation circuit 302 implements a unitary transformation U on an input state $|\psi\rangle$ and an ancilla state $|\varphi\rangle$ which is prepared independent of the input state $|\psi\rangle$. Either of the input state $|\psi\rangle$ and the ancilla state $|\varphi\rangle$ can be associated with one or more qubits, but in most examples disclosed herein the ancilla state $|\psi\rangle$ corresponds to a single qubit, and the ancilla state $|\varphi\rangle$ is associated with a plurality of qubits that are arranged to provide input values for a function of interest. After application of the unitary transformation U by the transformation circuit 302, a register holding the resulting ancilla state is measured by a measurement circuit 304. If a predetermined (desired) measurement result x is obtained, a switch 306 is coupled so as to deliver a state $V|\psi\rangle$ as an output. If the predetermined (desired) measurement result x is not obtained, the switch 306 is coupled via a classical control input 305 so as to deliver a processed state $|\psi'\rangle$ corresponding to the input state $|\psi\rangle$ to a circuit 310. The processed state $|\psi'\rangle$ differs from the input state $|\psi\rangle$ by a Clifford or other operation. The circuit 310 applies a Clifford (or other) operation $W_x$ to the processed state $|\psi\rangle$ so as to obtain the input state $|\psi\rangle$ that is then routed to the input of the circuit 302. The circuit then processes the input state and the ancilla state $|\varphi\rangle$ again. As shown in FIG. 3, upon success, a desired output state $V|\psi\rangle$ is available.

It can be convenient to configure the circuit 300 so that measurement of an outcome (0, . . . , 0) at the measurement circuit 304 is associated with success, but success can be associated with other outcomes as well. In most examples, input qubits are assumed to be in a $|0\rangle$ state, but other states can be used. Typically, the input and ancilla qubits are coupled to the circuit 302 so that, upon success, a value of a selected function of variables defined by the ancilla state $|\varphi\rangle$ is available based on the output state $V|\psi\rangle$. The ancilla state $|\varphi\rangle$ can be defined with a plurality of qubits, with each qubit representing a different input value.

RUS Multiplication Circuits

Figure 4:
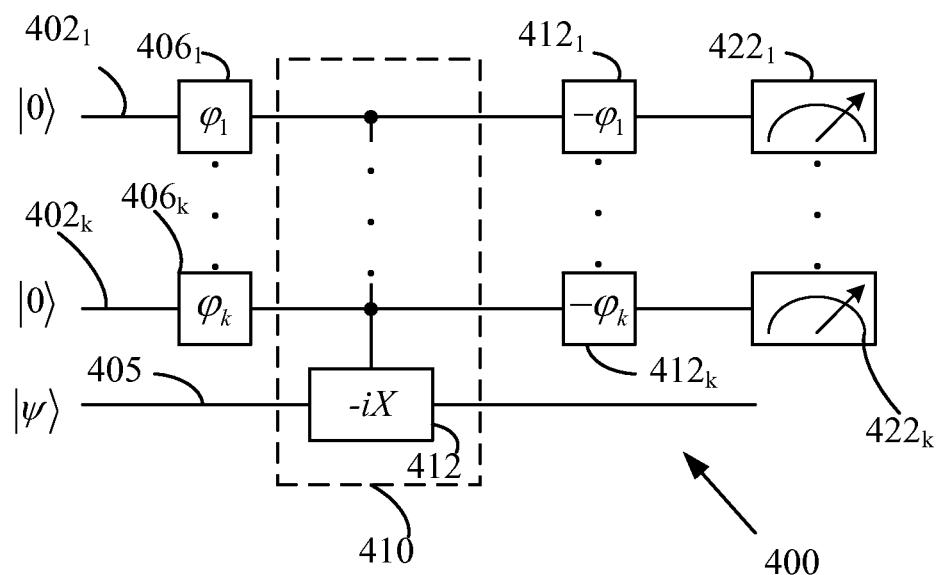
FIG. 4 illustrates a gearbox (GB) circuit.

Representative RUS circuits receive a series of single qubit rotations, and map this series to a single qubit rotation. These RUS circuits preferably have a relatively high probability of success, and can be corrected upon failure. One representative circuit 400 referred to herein as a gearbox (GB) circuit is illustrated in FIG. 4. As shown in FIG. 4, the circuit 400 includes rotation gates $406_1, \ldots, 406_k$ that are coupled to respective qubits $402_1, \ldots, 402_k$ that are associated with rotations $\varphi_1, \ldots, \varphi_k$, i.e., produce rotations $e^{-i\varphi_1 X}, \ldots, e^{-i\varphi_k X}$. Additional qubits and rotation gates associated with other rotations can be included, but only two qubit and the associated rotation gates are shown in FIG. 4. A target qubit 405 in a state $|\psi\rangle$ and the rotation gates $406_1, \ldots, 406_k$ are coupled to a control gate 410 that includes a $-iX$ gate that is applied to the qubit 405 as controlled by the qubits $402_1, \ldots, 402_k$. The qubits $402_1, \ldots 402_k$ are then coupled to rotation gates $412_1, \ldots, 412_k$ that apply rotations $-\varphi_1, \ldots, -\varphi_k$ and to measurement circuits $422_1, \ldots, 422_k$. In the circuit 400, the rotations $\varphi_1, \ldots, \varphi_k$ are applied to the target qubit 405 if the measurements produced by the measurement circuits $422_1, \ldots, 422_k$ correspond to the state $|0\rangle$ for each of the qubits $402_1, \ldots, 402_k$. The state $|0\rangle$ thus corresponds to success; if the measurement circuits $422_1, \ldots, 422_k$ return values associated with the state $|1\rangle$, the state of the target qubit does not correspond to that associated with the rotations $\varphi_1, \ldots, \varphi_k$ and the target qubit 405 is processed again.

A gearbox circuit such as that of FIG. 4, produces the following rotation on a target qubit in response to ancilla qubit phases $(\phi_1, \ldots, \phi_k)$ upon success:

$$GB(\phi_1, \ldots, \phi_k) \mapsto \arctan(\tan^2(\arcsin(\sin(\phi_1) \ldots \sin(\phi_k)))) \approx \phi_1^2 \ldots \phi_k^2.$$

Thus, for small values of the phases $(\phi_1, \ldots, \phi_k)$, a Taylor series associated with the target qubit rotation is a function of even powers of the phases, and lacks odd powers. Thus, a gearbox circuit can be used to produce qubit phases corresponding to even powers of input variables. Upon failure, the rotation of the target qubit corresponds to that produced by a single Clifford gate that can be corrected by application of a gate that provides an inverse operation. Odd powers can be obtained by shifting the input phases by $\pi/4$, but such a shift can reduce circuit probability of success and is associated with Taylor series that converge slowly.

Using this idea of shifting the input phases by $\pi/4$, a multiplication can be implemented using a gearbox circuit. Previously, it was only known that gearboxes can be used to multiply in conjunction with a squaring operation disclosed by N. Wiebe and V. Kliuchnikov, "Floating Point Representations in Quantum Circuit Synthesis," New J. Phys. 15, 093041 (2013).

An alternative circuit 500, referred to herein as a programmable ancilla rotation (PAR) circuit, is illustrated in FIG. 5. Ancilla qubits $501_1, \ldots, 501_k$ in a $|0\rangle$ states are coupled to respective rotation gates $502_1, \ldots, 502_k$ that are in turn coupled to a control gate 506. The control gate 506 includes a Pauli-X rotation gate 508 that is coupled to a target qubit 503. An inverse 510 of generalized Bell State circuit is coupled to the ancilla qubits $501_1, \ldots, 501_k$ and includes a CNOT gate 512 for which a selected qubit (in this case, the ancilla qubit $501_1$) serves as a control, and a Hadamard gate 514 which is coupled to the ancilla qubit $501_1$. Other qubits can be used as controls, and this example is for convenient illustration. After processing by the circuit 510, the ancilla qubits $501_1, \ldots, 501_k$ are coupled to respective measurement circuits $520_1, \ldots, 520_k$. If all the measurement circuits $520_1, \ldots, 520_k$ produce measurements corresponding to a generalized Bell state (all ancilla qubits in $|0\rangle$ state or all ancilla qubits in a $|1\rangle$ state upon measurement), the rotations $(\phi_1, \ldots, \phi_k)$ are present on the phase of the target qubit 503 as follows:

$$PAR(\phi_1, \ldots, \phi_k) \mapsto \pm\arctan(\tan(\phi_1) \ldots \tan(\phi_k)) \approx \phi_1 \ldots \phi_k.$$

The + sign is associated with a measured generalize Bell state corresponding to a sum of states $|0\rangle^k + |1\rangle^k$ and the sign is associated with a measured generalized Bell state corresponding to a difference of states $|0\rangle^k - |1\rangle^k$. For any other measurement outcome, the PAR circuit is an identity operation on the target qubit. Thus, PAR circuits can be used to produce a phase corresponding to odd powers of input variables on a target qubit. The outcome associated with the −1 sign can be eliminated using the oblivious amplitude amplification version of the PAR circuit.

Figure 17:
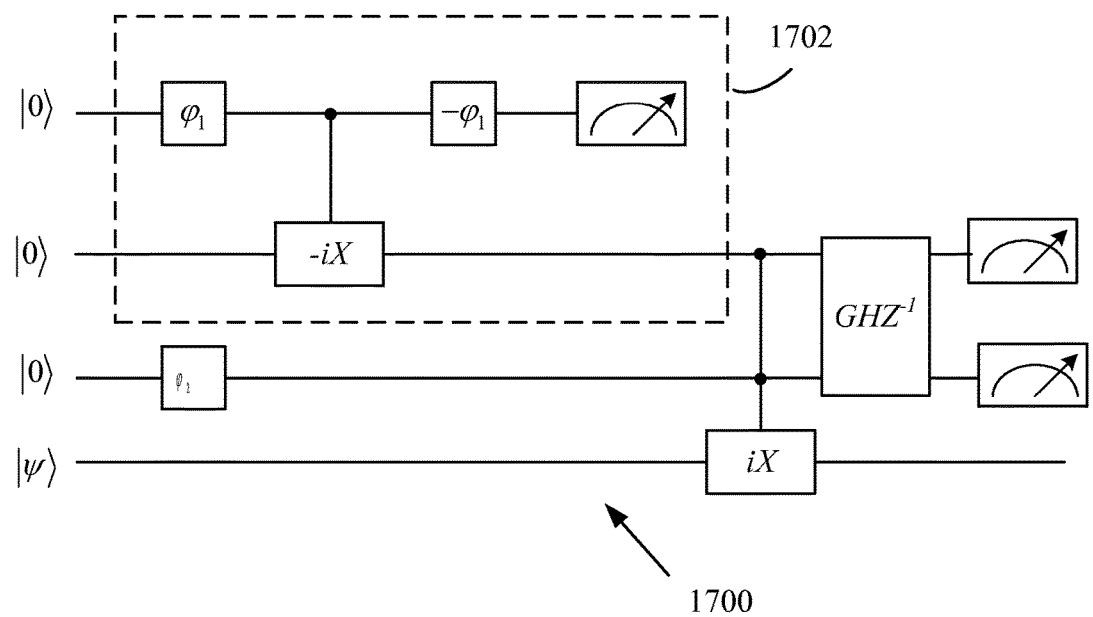
FIG. 17 illustrates a representative PAR circuit that includes a gearbox sub-circuit.

Various combinations of PAR and GB circuits are possible. For example, $\arctan(\tan^2(\phi_1)\tan(\phi_2))$ can be implemented with the circuit 1700 of FIG. 17 which includes a gearbox sub-circuit 1702.

RUS-Based Function Evaluation

Figure 6A:
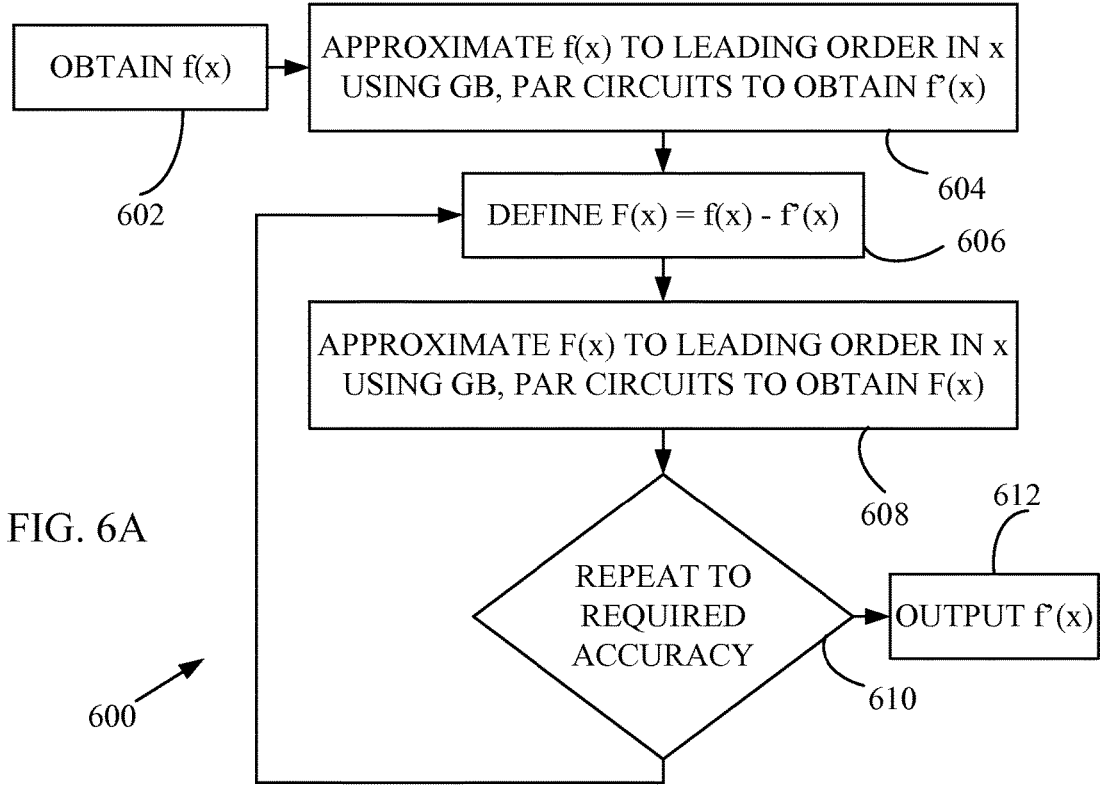
FIGS. 6A-6B illustrate methods for estimating values of a function using RUS multiplication circuits.

A general method 600 for evaluating arbitrary functions $f(x)$ is illustrated in FIG. 6A. At 602, a function definition and one or more values (x) at which the function is to be evaluated are obtained. For convenience, the value x is shown as a single value, but $f(x)$ can be a function of multiple variables, and x then represents values for each of the multiple variables. At 604, $f(x)$ is approximated as $f'(x)$ using suitable RUS gearbox and PAR circuits. At 606, a difference function F(x) is defined, and at 608, the difference function is approximated as F'(x) using RUS gearbox and PAR circuits. Then $f'(x)$ gets set to $f'(x)+F'(x)$. If a sufficiently accurate estimate has been obtained as determined at 610, one or more estimated values are output at 612. Otherwise, additional difference functions are defined at 606 and estimation continues until a selected accuracy is obtained. Pseudocode for such a method is provided in FIG. 6B.

Figures 6B, 7:
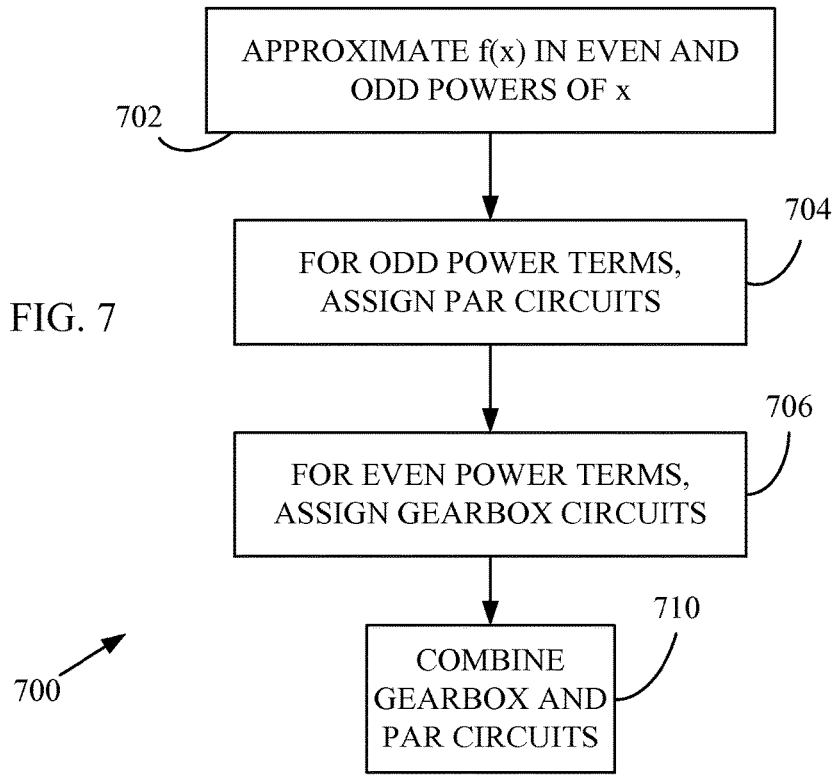
FIG. 7 illustrates a method of circuit design.

A method 700 of defining a quantum circuit for evaluation of a function is illustrated in FIG. 7. At 702, the function is approximated as even and odd powers of one or more input variables. At 704, circuits for odd power terms are assigned, typically PAR circuits. In some cases, gearbox circuits are used with suitable offsets, but as noted above, implementations without offsets tend to be simpler. At 706, circuits for even terms are defined, typically gearbox circuits. In some cases, PAR circuits are used with suitable offsets, but as noted above, implementations without offsets tend to be simpler. At 710, the selected PAR and gearbox circuits are coupled together to define a circuit for the selected function.

Enhancing RUS Circuit Accuracy

As discussed above, both the PAR and GB circuits produce qubit phases based on trigonometric functions of the input variables. For small values of input variables, the circuit outputs correspond to products or squares of product of the input values, neglecting higher order terms. To more accurately obtain such products, the contributions of these higher order terms can be reduced or eliminated. Properties of the PAR and GB circuits along with an addition circuit are shown in FIG. 8A. As shown in FIG. 8A, the PAR and GB circuits have more complex outputs than simple products of powers of products. Probabilities of success are tabulated, and correction circuits used in case of failure are noted as well. FIG. 8B lists some additional properties of gearbox circuits.

One approach to correcting PAR and GB circuit outputs is to use additional PAR or GB circuits to estimate correction terms so that the appropriate phase correction to the target qubit can be made. Circuits that use such correction include additional qubits, and alternative approaches are preferred. Multiplication of two inputs with a single PAR circuit produces a result with an $O(x^4)$ error. For convenience, circuits that produce errors $O(x^n)$ are referred to as $M^n$. The PAR circuit alone is an $M^4$ circuit. If x then a Taylor series representing the output of PAR (ax,bx) (i.e., $\arctan(x)=x-x^3/3+\ldots$ and $\tan(x)=x+x^3/3+\ldots$), then:

$$PAR(ax, bx) = \arctan(\tan(ax)\tan(bx)) = abx^2 + \frac{1}{3}(ab^3x^4 + ba^3x^4) + O(x^6).$$

The error term in $O(x^4)$ can be cancelled using $GB(ax)=a^2x^2+O(x^4)$ and then applying two more PAR circuits in series and Taylor expanding the result as:

$$PAR(ax,bx)-PAR(ax,bx,GB(ax),\arctan(\tfrac{1}{3}))-PAR(ax, bx,GB(bx),\arctan(\tfrac{1}{3}))=abx^2+O(x^6).$$

While this approach does work, a simpler approach disclosed below is typically more convenient to implement.

Each term in PAR(ax,bx) consists of at least one a and b so that $(1-a^2x^2/3-b^2x^2/3)$ can be multiplied by PAR(ax,bx) to achieve the desired result. An efficient way to do this is to note that $$\tan(x+\pi/4)=1+2x+O(x^2).$$

Thus for any analytic function $f(x)$
$\arctan(\tan(ax)\ \tan(bx)\ \tan(f(x)+\pi/4))=\arctan(\tan(ax)\ \tan(bx)+2f(x)\tan(ax)\tan(bx)+O(f(x))^2).$ The choice of $f(x)$ used in an $M^6$ circuit shown in FIG. 9 is $$f(x)=GB(ax,\arcsin(\sqrt{1/6}))-GB(bx,\arcsin(\sqrt{1/6}))=a^2x^2/6-b^2x^2/6+O(x^4),$$

which along with the PAR circuit error shows that $$\arctan(\tan(ax)\tan(bx)\tan(f(x)+\pi/4)) =$$
$$\arctan(\tan(ax)\tan(bx) - a^3bx^4/3 - b^3ax^4/3 + O(x^6)). =$$
$$\arctan(\tan(ax)\tan(bx)) - a^3bx^4/3 - b^3ax^4/3 + O(x^6) = abx^2 + O(x^6).$$

$M^6$ therefore gives a sixth order approximation to the product of two numbers using a PAR circuit. Circuits for other orders can be similarly obtained. The $\pi/4$ phase shift reduces the probability of success, and is to be used only as needed.

FIG. 9 is a table summarizing circuit designs for $M^4$, $M^6$, and $M^8$ obtained in this manner along with numbers of qubits needed for implementation. The constants are $\gamma_2=\arcsin(1/\sqrt{6})$ and $\gamma_3=\arcsin(1/\sqrt{15})$. Circuits are optimized for width and are meant to be executed from right to left in the PAR circuit to allow the left most qubits to be used as ancillas for gearbox operations appearing to their right.

Figures 11, 12:
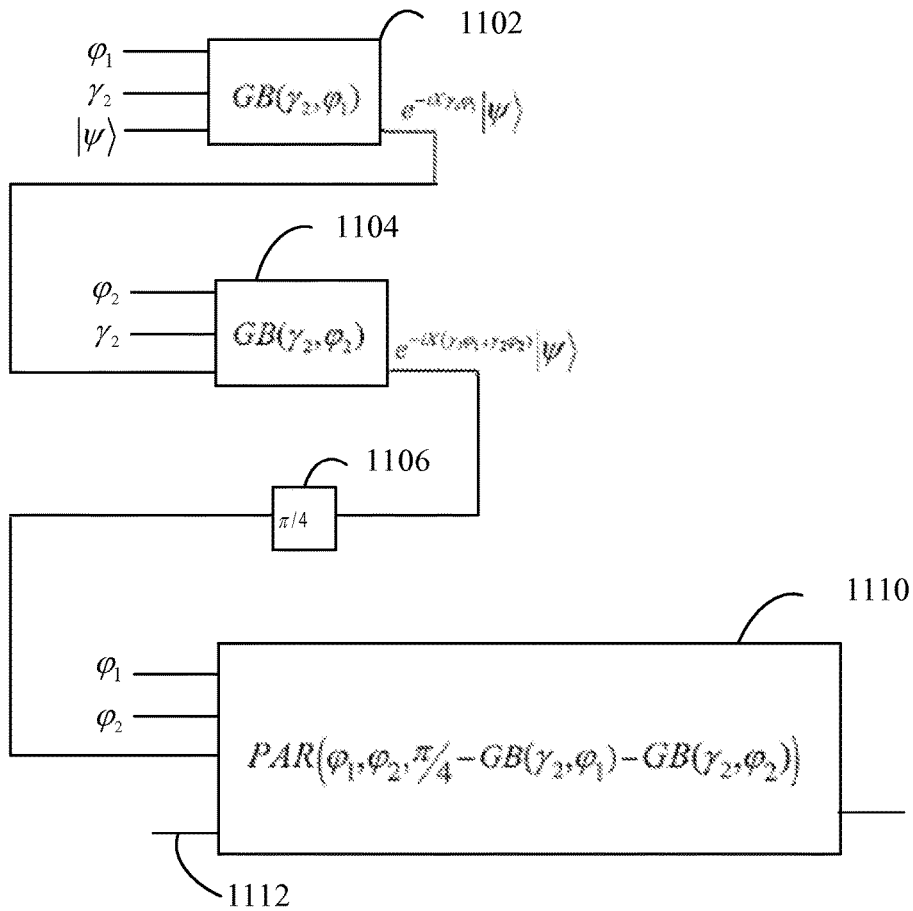
FIG. 11 illustrates an alternative multiplication circuit.
FIG. 12 is a table of Chebyshev approximations for use in calculating reciprocals.

FIG. 10 illustrates an $M^4$ circuit 1000 that includes a PAR circuit 1002 that is coupled to ancilla qubits 1004, 1006 to which input values are applied. A state $|\psi\rangle$ of a target qubit 1008 is rotated by the PAR circuit 1002 (upon success) to produce an output state $e^{-iX\varphi_1\varphi_2}|\psi\rangle$. Coupling of the output state to the input in case of failure is illustrated as 1010, but a correction gate or gates are not shown. FIG. 11 illustrates an $M^6$ circuit 1100 that includes GB circuits 1102, 1104, a rotation by a constant gate 1106, and a PAR circuit 1110 that provides a product as phase (rotation) on a target qubit 1112.

The disclosed methods and circuits permit realization of quantum computation for most functions using multiplication and addition operations. In some cases, Taylor series (or other series expansions) are used and various products of function variables are mapped to suitable circuits such as combinations of PAR and GB circuits. Particular designs can be selected based on a preferred error limit, to reduce a total number of qubits, or based on other considerations. Quantum circuits for integer multiplication, carry-ripple multiplication, and table look-up multipliers can constructed as well.

RUS Circuits for Evaluation of Reciprocals

In some applications, a reciprocal of a variable is to be determined, i.e., a rotation the form $e^{-iX/a}$ is to be obtained, for some value a stored as a quantum state. One approach to determining reciprocals is based on Newton's method. This method converges quadratically for a good initial estimates and requires only multiplication and addition. In particular, if $x_n$ is an approximation to the value of the reciprocal then Newton's method provides a new approximation $x_{n+1}=2x_n-ax_n^2$. This process can be repeated starting at a reasonable guess such as $x_1=2^{-j\ log_2 ak}$ and iterated until the error is sufficiently small.

Other methods for computing the reciprocal can be used as well, based on a Chebyshev approximant and a binomial method. The first step in both of these methods generally involves rescaling a to avoid diverging coefficients that appears in a direct application of Newton's method. This rescaling can be expressed as $$\frac{1}{a} = 2^{-jlog_2 ak}\left(\frac{1}{2^{-jlog_2 ak}a}\right),$$

wherein $2^{-j\ log_2 ak}a \in [½,1]$. A new variable y can be introduced as $y=1-2^{-j\ log_2 ak}a$, wherein $y \in [0,½]$. This variable is a natural quantity to use in a power series expansion because it is strictly less than ½. In other words, a power series approximation in powers of y is to be found to $$2^{-jlog_2 ak}\left(\frac{1}{1-y}\right).$$

Suitable methods are based on Taylor series, Chebyshev polynomials and the binomial division algorithm. Taylor series tend to provide poor accuracy for this application due to slow convergence.

Using a Chebyshev polynomial expansion, the problem of finding the reciprocal is reduced to that of implementing a polynomial. This can be achieved by using the multiplication formulas provided in above. The three lowest-order Chebyshev approximants to the rescaled reciprocal $1/(1-y)$ are given in the table of FIG. 12. PAR circuits can be avoided by using a gearbox circuit to implement squaring.

The binomial method is an alternative method for computing the reciprocal. The binomial method is based on the expansion $$\frac{1}{1-y} \approx (1+y)(1+y^2) \ldots (1+y^{2^{n-1}})$$

which can be implemented as a series of multiplications.

RUS-Based Square Wave Representations of Functions

Figure 13:
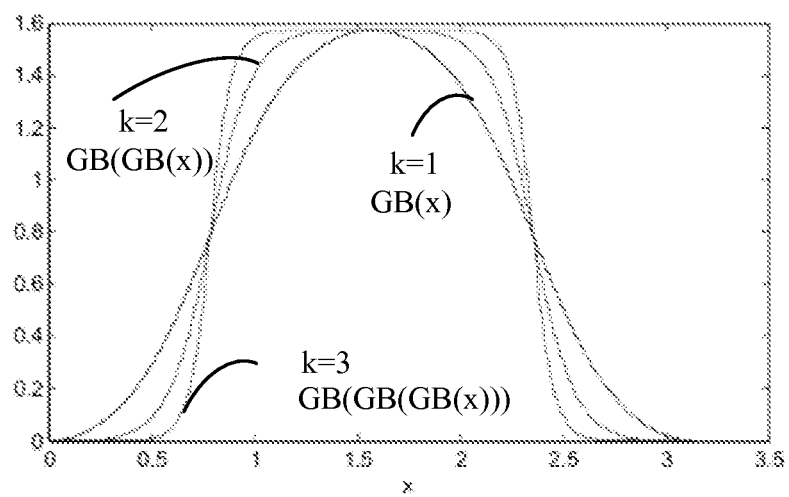
FIG. 13 illustrates square-wave behavior of iteratively applied gearbox circuits.
Figure 14:
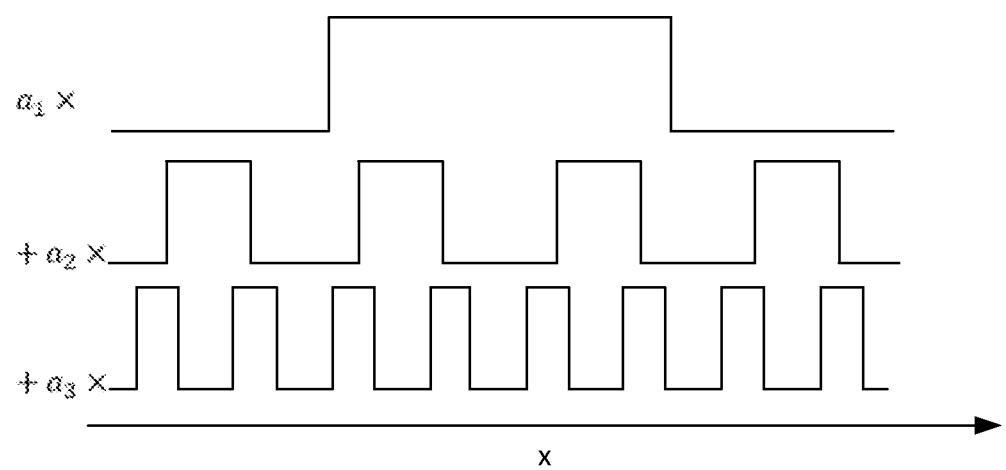
FIG. 14 illustrates square waves produced with gearbox circuits.
Figures 15, 16:
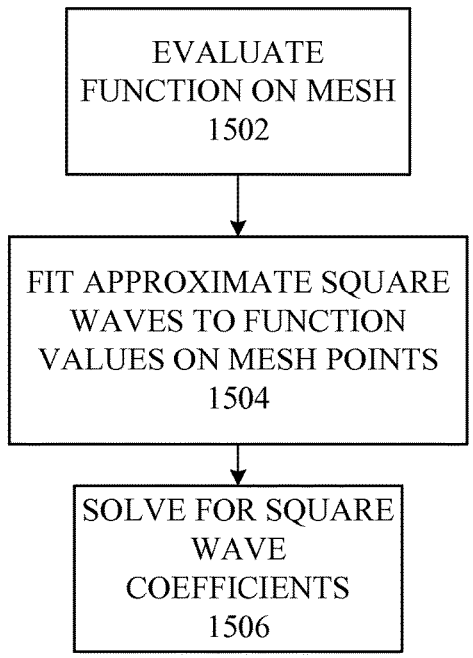
FIGS. 15-16 illustrate methods of fitting gearbox square wave functions to a mesh so as to approximate a function.

Gearbox (and PAR) circuits approximate square waves when applied iteratively. FIG. 13 illustrates three iterative applications of gearbox circuits showing how these iterations approach a square wave. FIG. 14 illustrates gearbox square waves having different periods determined by coefficients $a_1$, $a_2$, $a_3$. This behavior can be used to estimate a function value as follows. Referring to FIG. 15, a function is evaluated on a mesh of points at 1502. Square waves are fit to the mesh points at 1504, and at 1506, coefficients for each of the square waves are determined. This procedure is described in more detail in the pseudo code of FIG. 16.

Classical and Quantum Computing Environments

Figure 18:
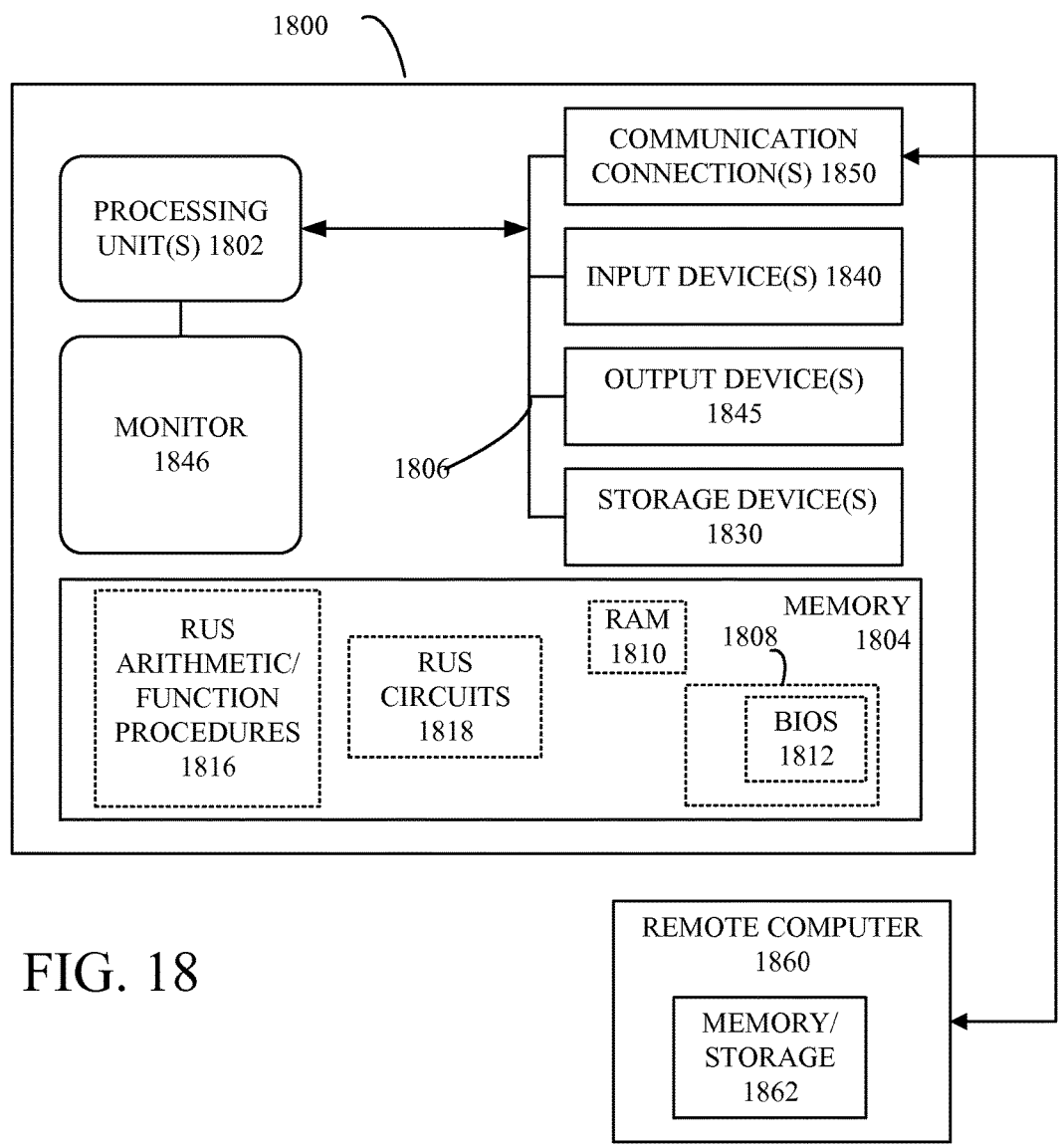
FIG. 18 is a block diagram of a representative computing environment in which the disclosed methods can be implemented.

FIG. 18 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 18, an exemplary system for implementing the disclosed technology includes a general purpose computing device in the form of an exemplary conventional PC 1800, including one or more processing units 1802, a system memory 1804, and a system bus 1806 that couples various system components including the system memory 1804 to the one or more processing units 1802. The system bus 1806 may be any of several types of bus structures including a memory bus or memory controller, a peripheral bus, and a local bus using any of a variety of bus architectures. The exemplary system memory 1804 includes read only memory (ROM) 1808 and random access memory (RAM) 1810. A basic input/output system (BIOS) 1812, containing the basic routines that help with the transfer of information between elements within the PC 1800, is stored in ROM 1808.

As shown in FIG. 18, computer-executable instructions for implementing RUS arithmetic operations such as multiplication and function estimation are stored in a memory portion 1816 and includes instructions for, for example, solving integer equations, evaluating and solving norm equations, and random sampling for determination of r values. In addition, a memory portion 1818 stores RUS multiplication circuit definitions, descriptions, arrangements, and methods as disclosed above. Computer-executable instructions are also stored for receiving rotation angles and precisions as well as communicating circuit definitions.

The exemplary PC 1800 further includes one or more storage devices 1830 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 1806 by a hard disk drive interface, a magnetic disk drive interface, and an optical drive interface, respectively. The drives and their associated computer readable media provide nonvolatile storage of computer-readable instructions, data structures, program modules, and other data for the PC 1800. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 1830 including an operating system, one or more application programs, other program modules, and program data. Storage of quantum syntheses and instructions for obtaining such syntheses can be stored in the storage devices 1830 as well as or in addition to the memory 1804. A user may enter commands and information into the PC 1800 through one or more input devices 1840 such as a keyboard and a pointing device such as a mouse. Other input devices may include a digital camera, microphone, joystick, game pad, satellite dish, scanner, or the like. These and other input devices are often connected to the one or more processing units 1802 through a serial port interface that is coupled to the system bus 1806, but may be connected by other interfaces such as a parallel port, game port, or universal serial bus (USB). A monitor 1846 or other type of display device is also connected to the system bus 1806 via an interface, such as a video adapter. Other peripheral output devices, such as speakers and printers (not shown), may be included. In some cases, a user interface is display so that a user can input a circuit for synthesis, and verify successful synthesis.

The PC 1800 may operate in a networked environment using logical connections to one or more remote computers, such as a remote computer 1860. In some examples, one or more network or communication connections 1850 are included. The remote computer 1860 may be another PC, a server, a router, a network PC, or a peer device or other common network node, and typically includes many or all of the elements described above relative to the PC 1800, although only a memory storage device 1862 has been illustrated in FIG. 18. The personal computer 1800 and/or the remote computer 1860 can be connected to a logical a local area network (LAN) and a wide area network (WAN). Such networking environments are commonplace in offices, enterprise wide computer networks, intranets, and the Internet.

When used in a LAN networking environment, the PC 1800 is connected to the LAN through a network interface. When used in a WAN networking environment, the PC 1800 typically includes a modem or other means for establishing communications over the WAN, such as the Internet. In a networked environment, program modules depicted relative to the personal computer 1800, or portions thereof, may be stored in the remote memory storage device or other locations on the LAN or WAN. The network connections shown are exemplary, and other means of establishing a communications link between the computers may be used.

Figure 19:
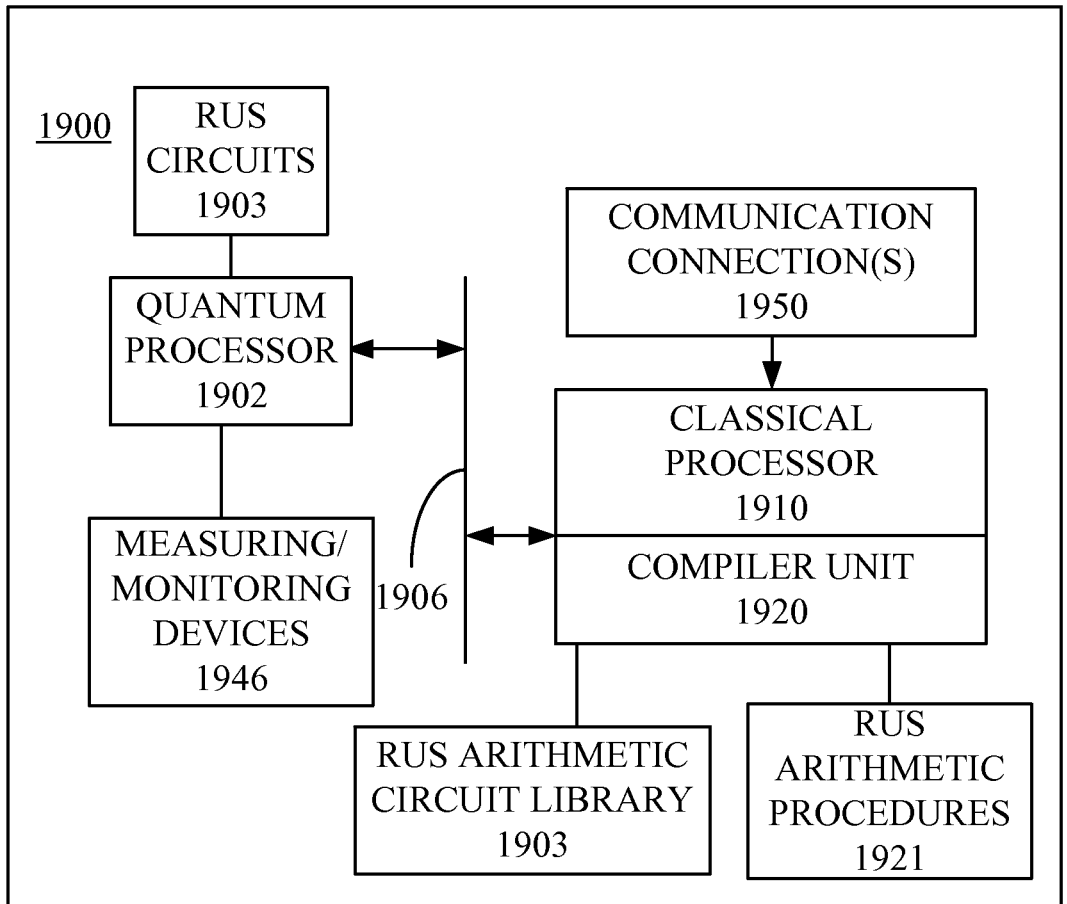
FIG. 19 is a block diagram of a representative computing environment that includes classical and quantum processing.

With reference to FIG. 19, an exemplary system for implementing the disclosed technology includes computing environment 1900, where compilation into braid pattern circuits is separated from the quantum processing that consumes the compiled circuits. The environment includes a quantum processing unit 1902 and one or more monitoring/measuring device(s) 1946. The quantum processor executes quantum circuits that are precompiled by classical compiler unit 1920 utilizing one or more classical processor(s) 1910. The precompiled quantum circuits such as RUS circuits 1903 for multiplication, function estimation, or other procedures are downloaded into the quantum processing unit via quantum bus 1906.

With reference to FIG. 19, the compilation is the process of translation of a high-level description of a quantum algorithm into a sequence of quantum circuits. Such high-level description may be stored, as the case may be, on one or more external computer(s) 1960 outside the computing environment 1900 utilizing one or more memory and/or storage device(s) 1962, then downloaded as necessary into the computing environment 1900 via one or more communication connection(s) 1950. Alternatively, the classical compiler unit 1920 is coupled to a classical processor 1910 and an RUS arithmetic procedure library 1921 that contains some or all procedures necessary to implement the methods described above as well as an RUS circuit library 1903 that stores compiled circuits for multiplication, series expansions, reciprocal determination, or square wave characterization.

Having described and illustrated the principles of our invention with reference to the illustrated embodiments, it will be recognized that the illustrated embodiments can be modified in arrangement and detail without departing from such principles. For instance, elements of the illustrated embodiment shown in software may be implemented in hardware and vice-versa. Also, the technologies from any example can be combined with the technologies described in any one or more of the other examples. Alternatives specifically addressed in these sections are merely exemplary and do not constitute all possible.

The invention claimed is:

1. A quantum circuit, comprising:
   a repeat-until-success (RUS) multiplication circuit coupled to a first ancilla qubit and a target qubit at respective RUS multiplication circuit inputs so as to produce, at a target qubit output, a target qubit phase based on a product of a phase coupled to the RUS multiplication circuit at the first ancilla qubit;
   a measurement circuit coupled to the first ancilla qubit at an RUS multiplication circuit output; and
   a correction circuit coupled to the measurement circuit to apply a correction to the target qubit if the measurement circuit indicates failure.

2. The quantum circuit of claim 1, wherein the multiplication circuit is a gearbox circuit.

3. The quantum circuit of claim 1, wherein the multiplication circuit is a PAR circuit.

4. The quantum circuit of claim 1, wherein a plurality of ancilla qubits are coupled to the RUS multiplication circuit, and the target qubit phase is based on a product of phases supplied to the RUS multiplication circuit associated with the plurality of ancilla qubits.

5. The quantum circuit of claim 4, wherein the RUS multiplication circuit is a gearbox circuit, and the target qubit phase corresponds to an even power of a product of the phases supplied to the RUS multiplication circuit with the plurality of ancilla qubits.

6. The quantum circuit of claim 4, wherein the RUS multiplication circuit is a gearbox circuit, and the target qubit phase corresponds to an odd power of a product of the phases supplied to the RUS multiplication circuit with the plurality of ancilla qubits.

7. The quantum circuit of claim 1, wherein the target qubit phase is associated with a reciprocal.

8. The quantum circuit of claim 7, wherein the correction circuit includes at least one Clifford gate.

9. At least one computer readable storage device comprising computer executable instructions for a method, comprising:
   obtaining a representation of a function of a plurality of variables;
   expressing at least a portion of the representation based on at least one product of the plurality of variables; and
   assigning at least one repeat-until-success quantum circuit so as to produce a qubit phase corresponding to the at least one product upon success.

10. The at least one computer readable storage device of claim 9, wherein the method further comprises identifying odd and even powers of the plurality of variables in the portion of the representation, and assigning the at least one repeat-until-success quantum circuit based on the identification.

11. The at least one computer readable storage device of claim 9, wherein the at least one quantum circuit is a gearbox circuit if an even power is identified or a programmable ancilla rotation (PAR) circuit if an odd power is identified.

12. The at least one computer readable storage device of claim 9, wherein the at least one quantum circuit is a gearbox circuit or a PAR circuit.

13. The at least one computer readable storage device of claim 9, wherein method further comprises obtaining an error limit associated with the product, and assigning a plurality of quantum circuits based on the error limit so as to compensate product errors.

14. The at least one computer readable storage device of claim 9, wherein method further comprises arranging the at least one selected quantum circuit so that the variables of the plurality of variables are coupled to respective ancilla qubits, the target qubit receives the qubit phase based on an error limit associated with the product, and a plurality of quantum circuits is assigned based on the error limit.

15. The at least one computer readable storage device of claim 9, wherein the method further comprises representing the function as a series of products of the variables.

16. The at least one computer readable storage device of claim 15, further comprising defining a quantum correction circuit that is coupled to the target qubit and returns the target qubit to an initial state upon failure.

17. The at least one computer readable storage device of claim 15, wherein values of the variables of the plurality of variables are represented as rotations on respective qubits.

18. The at least one computer readable storage device of claim 9, wherein the representation of the function includes a least one reciprocal of a variable that is obtained based on a series representation.

19. The at least one computer readable storage device of claim 9, wherein at least one of the variables is offset so as change an even or odd power term in a series expansion to an odd or even power term, respectively.

20. A method of obtaining a value of a function in quantum computer, comprising:
   representing values of a plurality of variables on respective ancilla qubits;
   coupling the ancilla qubits to a quantum repeat-until-success circuit that includes at least one gearbox circuit or PAR circuit;
   obtaining a corresponding value of the function as a phase on a target qubit if output states of the ancilla qubit correspond to success; and
   correcting the phase of the output target qubit upon failure, and coupling the corrected target qubit state to a target qubit input of the quantum repeat-until-success multiplication circuit.

21. The quantum circuit of claim 1, wherein the product of the phase coupled to the first ancilla qubit is a power of the phase coupled to the first ancilla qubit or a product of the phase coupled to the first ancilla qubit with a second phase that is coupled to a second ancilla qubit.

* * * * *